(12) United States Patent
Sogard et al.

(10) Patent No.: US 8,842,296 B2
(45) Date of Patent: Sep. 23, 2014

(54) METHODS AND DEVICES FOR REDUCING ERRORS IN GOOS-HÄNCHEN CORRECTIONS OF DISPLACEMENT DATA

(71) Applicant: Nikon Corporation, Chiyoda-ku (JP)

(72) Inventors: Michael Sogard, Menlo Park, CA (US); Daniel G. Smith, Tucson, AZ (US); David M. Williamson, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/801,415

(22) Filed: Mar. 13, 2013

(65) Prior Publication Data

US 2013/0293900 A1 Nov. 7, 2013

Related U.S. Application Data

(60) Provisional application No. 61/641,747, filed on May 2, 2012.

(51) Int. Cl.
| | |
|---|---|
| *G01B 11/14* | (2006.01) |
| *G01B 11/02* | (2006.01) |
| *G01B 21/04* | (2006.01) |
| *G03F 7/00* | (2006.01) |

(52) U.S. Cl.
CPC ............. *G01B 11/14* (2013.01); *G01B 11/026* (2013.01); *G01B 21/045* (2013.01); *G03F 7/00* (2013.01)
USPC .......................................... 356/616; 356/614

(58) Field of Classification Search
CPC ............. G01N 21/552; G01N 21/648; G01N 21/7703; G01N 2021/0346; G01N 21/05; G01N 21/553; G01N 21/6428; G01N 21/7746; G01N 2021/7723; G01N 2021/7776; G01N 21/39; G01N 21/41; G01N 2021/1782
See application file for complete search history.

(56) References Cited

U.S. PATENT DOCUMENTS

| | | | |
|---|---|---|---|
| 7,940,374 B2 | 5/2011 | Lyons | |
| 2011/0071784 A1* | 3/2011 | Smith et al. ..................... | 702/94 |
| 2014/0036245 A1* | 2/2014 | Sogard ........................... | 355/56 |

* cited by examiner

*Primary Examiner* — Michael P Stafira
(74) *Attorney, Agent, or Firm* — Klarquist Sparkman, LLP

(57) ABSTRACT

An exemplary method involves, in a system comprising a tool that performs a task on a workpiece, a method for determining displacement of the workpiece relative to the tool. Respective displacements of loci of at least a region of the workpiece are mapped using a Goos-Hänchen-insensitive (GH-insensitive) displacement sensor to produce a first set of physical displacement data for the region. Also mapped are respective displacements, from the tool, of the loci using a GH sensitive sensor to produce a second set of optical displacement data for the region. Goodness of fit (GOF) is determined of the second set of data with the first set. According to the GOF, respective GH-correction (GHC) coefficients are determined for at least one locus of the region. When measuring displacement of the at least one locus in the region relative to the tool, the respective GHC coefficient is applied to the measured displacement to reduce an error that otherwise would be present in the measured displacement due to a GH effect.

32 Claims, 7 Drawing Sheets

METHODS AND DEVICES FOR REDUCING ERRORS IN GOOS-HÄNCHEN CORRECTIONS OF DISPLACEMENT DATA

CROSS-REFERENCE TO RELATED APPLICATION

This application claims priority to, and the benefit of, U.S. Provisional Application No. 61/641,747, filed on May 2, 2012, which is incorporated herein by reference in its entirety.

FIELD

This disclosure is directed to, inter alia, methods for determining position of a workpiece relative to a tool, especially along an axis of the tool. An example tool employing such methods is a microlithography tool that forms images of a pattern on the surface of a lithographic substrate using an imaging optical system. More specifically, the disclosure is directed to methods performed by optical devices (called "autofocus" devices when used in microlithography tools) in which the detected positions of light reflected from the substrate surface are used to determine changes in the height position (z-axis position) of the substrate relative to the imaging optical system.

BACKGROUND

Substantially all current microlithography tools include a device, called an "autofocus" device, used for achieving a specified sharpness ("focus") of images as produced on the surface of lithographic substrates. A conventional autofocus (AF) device automatically monitors position of the lithographic substrate along an axis (conventionally the z-axis or height axis) relative to the imaging optical system. The positions are usually determined based on a detected position of a beam of light reflected from the substrate surface. When the position data are obtained between exposures, the AF sensor must be very fast so as not to reduce throughput. Because of this speed requirement, AF sensors are usually "optical," usually involving the direction of a beam of light onto the surface of the substrate obliquely, at a glancing angle of incidence (for example, an angle of incidence greater than 80°). The position of light, reflected from the substrate surface, as incident on a detector corresponds to the z-position of the substrate. The light beam is usually incident on the substrate near the intended imaging site of the lithographic exposure. The substrate is coated with a layer of photoresist prior to exposure. Using the top surface of the resist as a convenient focal plane reference, an image is produced within the thickness of the photoresist layer.

Besides optical AF devices, other conventional devices for sensing substrate position are "physical" devices, such as an air gauge or capacitive gauge. Each of these types of devices has respective advantages and disadvantages. One type of air gauge comprises a gas-discharge port placed in proximity to the substrate surface. In the air gauge the port is coupled to a source of compressed air or other suitable gas. The gas discharged from the port changes pressure as a function of the nearness of the substrate surface to the port. Monitoring the pressure provides a detection of the corresponding distance of the substrate surface from the port (e.g., the vertical position, or "height") of the substrate. Air gauges can be very accurate, but they produce height data slowly when compared to certain types of optical AF sensors. Also, the air flow discharged from the air gauge can have an undesired thermal effect on the substrate and/or can be a source of contamination of the substrate.

Another device useful for measuring substrate position is a capacitive gauge (called a "cap sensor"), of which a small capacitive probe is placed near the substrate surface. The capacitance measured by the probe changes as a function of the position of the substrate (e.g., height of the substrate relative to the probe). Cap sensors can be adversely affected by electrical properties of the films and features on the substrate.

Optical sensors are easily configured to obtain many measurements at many locations on the substrate in parallel, thereby producing a large amount of data very rapidly. A cap sensor can be very fast when measuring a single point, but scaling the measurement speed to an entire substrate (e.g., a 450-mm diameter semiconductor wafer) is difficult to achieve.

Whereas physical sensors such as air gauges are accurate, they are too slow for practical use in high-volume manufacturing. In contrast, optical sensors are extremely fast, but can be adversely affected by the optical properties of the substrate surface and underlying structures, such as layers (usually but not necessarily patterned) already formed on the substrate during earlier process steps. Light reflected from the substrate frequently exhibits changes in intensity and/or phase that are largely unrelated to actual substrate height. An optical sensor may sense errors related to these changes, particularly changes that are non-linearly related to the thicknesses and refractive indices of the underlying layers. These errors are termed "AF errors" or "focusing errors." One source of AF errors arises from some of the AF light (which may form images of "slits" or "fringes" on the substrate) reflecting from previously formed patterned thin films beneath the surface of the substrate. The magnitude of AF errors of this general type can vary with the particular pattern(s) and other features in the previously formed layers on the substrate, and can vary with the thickness profiles of those layers. These AF errors can be substantial.

An exemplary AF error arising from the presence of thin-film layers previously formed on the substrate surface arises from the Goos-Hänchen (GH) effect, in which a substrate surface including thin films formed during earlier process steps produces a shift or offset in position of a beam of light reflected from the surface. This shift is not related to an actual change in position of the substrate, but can be mistaken for one. Patterning in previously formed thin films is not required for the GH effect to occur (but patterning can be a factor). Rather, the simple presence of the previously formed thin films is required. If the substrate has the same thin-film stack applied uniformly over the substrate surface, then the result usually is a substantially uniform GH effect and produces a uniform offset that is easily treated by introducing an offset from the measured substrate height. Otherwise, GH effects can vary appreciably over the substrate surface, depending upon regional variations of thickness and other parameters of the thin films over the surface as well as pattern variations from one region to the next. For example, a change in regional offset due to the GH effect can arise in an area containing memory relative to another area containing logic. Also, different patterns, although they may consist of the same material, may produce different offsets from GH effects by virtue of the structures, spatial frequencies, orientation, duty cycles, etc., of the respective patterns relative to other patterns.

In producing a GH effect, previously formed layers on the substrate surface can change the intensity of the reflected AF light and/or the phase of that light. According to one way of looking at the GH effect, a monochromatic AF beam incident on a reflecting surface is decomposed into multiple plane waves. The reflective surface (i.e., the substrate surface) produces a different phase for each of these plane waves, depending on the wave's angle of incidence. Over a small range of incidence angles, corresponding to a converging or diverging wavefront, the phase of reflection can either increase or decrease with the angle of incidence, which produces a tilted wavefront in the far field corresponding to a physical shift of the beam in the near field. The GH effect is the apparent shift of the beam, which produces an AF error.

In other words, if $\delta$ is the phase change on reflection, and $\theta$ is the angle of incidence, then the GH effect arises from the dependence of $\delta$ on $\theta$. (In fact, the GH effect and the related AF error can be considered to be proportional to the derivative of $\delta$ with respect to $\theta$, at least to a very good approximation.) This apparent image shift is also produced by an autofocus system that images a source "object" (e.g., a slit or fringes) onto the substrate surface at a glancing angle of incidence and then relays the image to a detector. The position of the image on the detector will depend not only on the height of the subject surface, but also on variations in intensity and variations of phase in AF light reflected from that surface (i.e., the apparent position changes according to the local GH effect). In an AF system, this means that variations in the surficial construction of the substrate, including its previously formed "stack" of multiple thin-film layers and printed circuit patterns, can produce an error in the surface height measurement; this is called the GH error.

A correction of a GH error is called a Goos-Hänchen correction (GHC). An example GHC is discussed in U.S. Patent Publication No. 2011/0071784 (called herein the "'784 reference"). Referring to FIG. 1, AF lights of variable wavelength and polarization (i.e., from a "broadband" source) 50 are reflected from a substrate and detected along with AF light reflected from a reference mirror (item 52). GH effects, assumed to be present, are estimated from measured changes in spectral and polarization properties of the light reflected from the substrate (on which a "stack" of previously formed layers has been formed). For example, the spectral and polarization properties may include a change in the change of phase with respect to the angle of incidence (and position on the substrate). The GH estimates thus obtained are used to estimate corresponding GHC's (item 58).

However, pattern effects are poorly addressed, if at all, in the '784 reference; rather, there is a presumption that the measured changes are due to GH effects (item 54). The AF system's estimates of substrate topography may have errors due to the pattern(s) previously formed on the substrate. These pattern errors arise because the reflectance pattern is overlaid on slit or fringe images, which produces errors in the estimates of their position.

The '784 reference uses beams of AF light produced by broadband sources 50 and reflected from the substrate to detectors. Initial determinations of substrate z-position may include variations in wavelength and phase spectra of the beams (items 52, 54). The initial determinations are used for determining corresponding GHC estimates (item 58) using either an "analog" or "digital" approach. The analog approach is based on the presumptions that changes in wavelengths and phase angles of AF light are generally associated with correspondingly different amounts of GH effect, and that changes in GH effect occurring over the substrate surface can be estimated from these changes in wavelength and phase spectra. Based on the determined GHC's, the wavelength and polarization spectra are adjusted (arrow 64) to "compensate" for corresponding errors presumed to have been introduced to the spectra by the GH effect. In the digital approach, spectral and phase components of the reflected beam are detected separately, and GH effects are estimated therefrom (item 58). The GH effects are used to determine corresponding GHC's that are applied in software to a filter in the illumination system (arrow 64). The GHC's can be used to apply a "correction" to an initial determined substrate position (items 60 and 62). The filter selects respective "corrective" wavelengths and/or polarizations aimed at reducing GH error. Adjusting the wavelength and polarization dependence of the GHC may be done by simulation, followed by an optimization step. The result is a series of coefficients multiplying GHC terms representing contributions from different wavelengths and polarizations. Unfortunately, the corrections thus determined have substantial inaccuracies, and there is currently no way in which to ascertain the reliability of the corrections.

In U.S. Pat. No. 7,940,374 and in Kahlenberg et al., "Best Focus Determination: Bridging the Gap Between Optical and Physical Topography," *Proc. SPIE* 6520 (2007), no attempt is made to measure or predict GHC's. Rather, AF measurements are made using a conventional optical AF sensor and a physical sensor (e.g., an air gauge or profilometer), and empirical corrections to AF are determined from these measurements. No direct GHC's are possible in areas of the substrate where both optical and physical sensors are not used. Correcting the optical sensor is not contemplated or performed; rather, data obtained by the optical sensor and by the physical sensor are used to produce an empirical "correction" map. Corrections for a selected chip region (die) are averaged over all dies (having the same pattern) on the substrate to produce an approximate "global" correction. The validity of the "global" correction is assumed to extend to all dies (having the same patterns) on other substrates as well. This method does not take into account the GH effects of actual thin-film variations existing between dies (e.g., middle regions versus peripheral regions) or between respective regions of individual dies.

True GHC provides respective region-specific corrections for various regions of the substrates, taking into account the actual patterns and other GH-specific features in each region. This is important because the GH error can change substantially with, for example, very small changes in thin-film thickness.

The approach described in the '784 reference can be distinguished from the approach in the '374 reference because the former in principle allows estimation of the GHC, even in situations in which physical-sensor measurements are lacking. However, the success of the GHC predictions depends on the actual properties of the patterned wafers (which are not taken into account) and may vary substantially from one location and/or condition to another. The '374 reference does not disclose either measurement or estimation of the GH effect.

The state of the prior art discussed above reveals an existing need for, inter alia, improved methods for correcting (or at least reducing) errors in GH corrections (GHC's) so that autofocus determinations can be made at a speed and accuracy currently demanded for microcircuit fabrication. There are various situations in which conventional GHC schemes as summarized above break down and do not provide adequate correction of the GH effect. An example situation is the presence of unusual pattern features in a particular location on the substrate that are not taken into account in GHC estimations made using prior-art methods.

SUMMARY

An exemplary method involves, in a system comprising a tool that performs a task on a workpiece, determining displacement of the workpiece relative to the tool. Respective displacements of loci of at least a region of the workpiece are mapped using a GH-insensitive displacement sensor (e.g., physical-displacement sensor) to produce a first set of displacement data for the region. This first set comprises, for example, displacement data that are either unadulterated or relatively unaffected by GH effects. For example, these data can be or include data obtained using physical displacement sensor(s). These data can be or include previously obtained data, such as but not limited to data present in a previously determined physical map of the region of the workpiece. Also mapped are respective displacements, from the tool, of the loci using at least one GH-sensitive sensor (e.g., optical displacement sensor(s)) to produce a second set of displacement data for the region. Goodness of fit (GOF) is determined of the second set of displacement data with the first set of displacement data. According to the GOF, respective Goos-Hänchen correction (GHC) coefficients are determined for the loci. When measuring displacement of the at least one locus in the region relative to the tool, the respective GHC coefficient is applied to the measured displacement to reduce error that otherwise would be present in the measured displacement due to a GH effect. An advantage of this method is its utilization of data that are not estimates of respective parameters but rather actual measurements of the parameters or at least sufficient knowledge of the parameters established beforehand.

In another embodiment of a method for determining displacement of an object from a desired location, at least one GH-sensitive sensor (e.g., optical sensor) is used that is responsive to a light beam reflected from a region on a surface of an object. The GH-sensitive sensor is used for determining respective displacements of one or more loci in the region to produce an optical displacement map of the region. Also, using at least one GH-insensitive (e.g., physical sensor), respective displacements of the one or more loci in the region are determined to produce a physical displacement map of the region. Data of the optical displacement map are fit to corresponding data of the physical displacement map. According to a GOF comparison of data of the optical displacement map to data of the physical displacement map, GHC coefficients corresponding to the data of at least the loci are determined. To a subsequent measurement of displacement of a locus of the region using at least one GH-sensitive sensor (e.g., optical sensor), corresponding GHC coefficients are applied to produce a measurement of substrate position in which GHC's are included. The data in the physical displacement map can be obtained using an air gauge as an exemplary physical sensor. To avoid interfering with the time budget for actual production, measurements obtained using the GH-insensitive sensor can be obtained during a particular time, such as process-development time.

The disclosure is also directed to methods for determining GHC's in an optical autofocus system that uses light reflected from a substrate to determine corresponding changes in a height of the substrate. In an embodiment of the method, an optical height sensor (or other GH-sensitive sensor) is used for obtaining a first set of height data of at least a region of the substrate. The height data correspond to respective loci on the substrate and comprise measurements involving at least one optical wavelength and/or at least one polarization state of light utilized by the optical height sensor. From the first set of height data, a first GHC function is determined that includes respective coefficients. A first map of the substrate surface is determined by applying the first GHC function to the first set of height data corresponding to at least the region. Using a physical height sensor, a second set of height data is obtained of at least the region of the substrate. From the second set of height data, a second map of the substrate surface is determined that corresponds to at least the region. In at least the region on the substrate, the first GHC function is corrected by comparing the first and second maps of the substrate.

Also within the scope of this disclosure are methods for automatically positioning a substrate in a lithography tool using an autofocus system, and including methods for correcting a GHC in an optical autofocus system in the tool that uses light reflected from a substrate to determine corresponding changes in the height of the substrate. An embodiment of the method of correcting the GH effect comprises using an optical height sensor (or other GH-sensitive sensor) to obtain a first set of height data of at least a region of the substrate. The height data corresponds to respective points on the substrate and comprises measurements involving at least one optical wavelength and/or at least one polarization state of light utilized by the optical height sensor. From the first set of height data, a first GHC function is determined that includes respective coefficients. A first topographic map of the substrate is obtained by applying the first GHC function to the first set of height data. Using a physical height sensor (or other GH-insensitive), a second set of height data is obtained of at least the region of the substrate. From the second set of height data, a second topographic map of the substrate is determined. In at least one region of substrate, the first GHC function is corrected by comparing the first and second topographic maps of the substrate. At least some data in the second set of height data can be obtained during a non-production use of the lithography tool, thereby not interfering with the production throughput of the tool.

This disclosure is also directed to focus controllers that are electrically connected to a processor in a lithography tool, wherein the focus controller is programmed or otherwise configured to position the substrate automatically in the lithography tool using an optical autofocus system. The processor programmed or otherwise configured to determine a GHC in the optical autofocus system by sensing light reflected from the substrate to determine corresponding changes in the height of the substrate. The GHC is determined by a method of which an exemplary embodiment comprises using an optical height sensor to obtaining a first set of height data of at least a region of the substrate, wherein the height data corresponds to respective points on the substrate and comprises measurements involving at least one optical wavelength and/or at least one polarization state of light utilized by the optical height sensor. From the first set of height data, a first GHC function is determined including respective coefficients. A first topographic map of the substrate is obtained by applying the first GHC function to the first set of height data. Using a physical height sensor, a second set of height data is obtained of at least the region of the substrate. From the second set of height data, a second topographic map of the substrate is obtained. In at least one region of substrate, the first GHC function is corrected by comparing the first and second topographic maps of the substrate.

DETAILED DESCRIPTION

Figure 1:
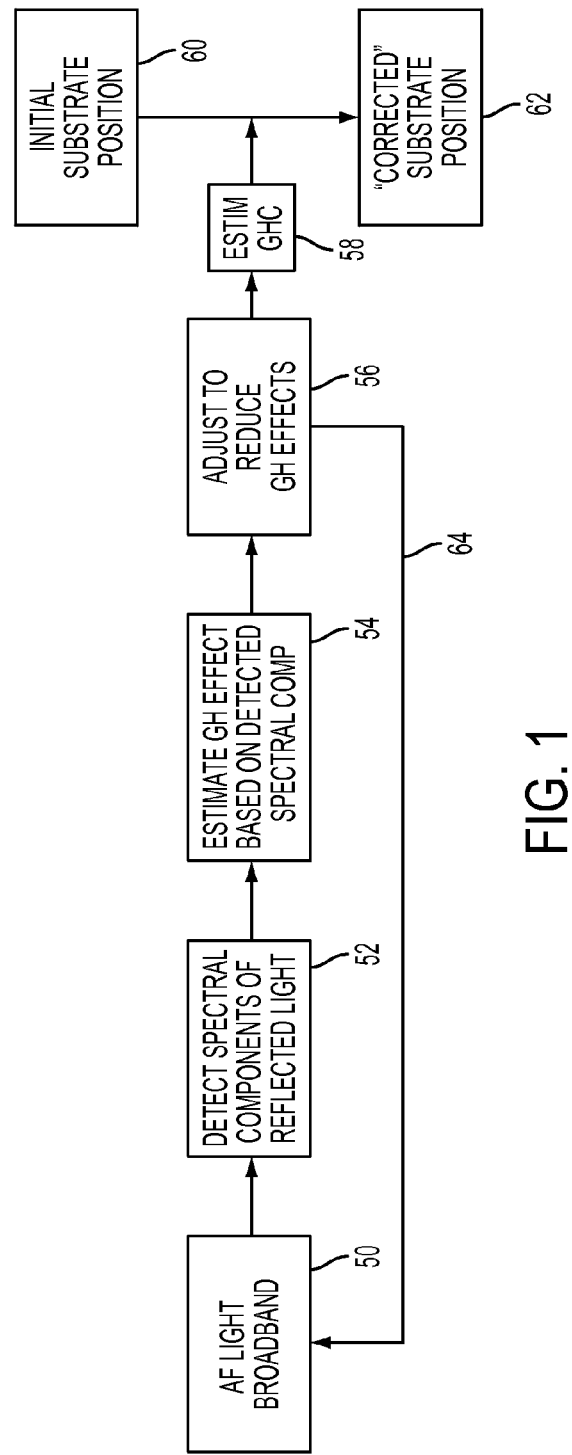
FIG. 1 is a flow chart of a prior art method for determining and applying a GHC correction to a determined position of a substrate or other positionable object.

The invention is described below in the context of representative embodiments that are not intended to be limiting in any way.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, apparatus, and methods are not limited to any specific aspect or feature or combinations thereof, nor do the disclosed systems, apparatus, and methods require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Compared to the prior art, the subject methods provide other means for obtaining GHC's and provide other types of GHC's. Rather than taking an empirical approach as used in the known prior art, the subject methods strive first to obtain or have knowledge (e.g., a priori knowledge) of actual features and/or actual surficial topography of layers on and/or beneath the substrate surface that can produce GH error, and then to determine GHC's based at least in part on that knowledge. This a priori knowledge can be based on measurements obtained using physical sensors, on measurements obtained using optical sensors, on previously obtained information on GH effects produced by certain patterns, and/or by theoretical calculations of expected GH effects, etc. The accuracy of GHC's actually determined is improved by the knowledge of actual situations on the substrate surface that tend to compromise GHC calculation methods and by determining GHC's that are more tailored to those situations. The subject methods can use multiple forms of a priori knowledge (some of which may also be empirical), which is better than using a GHC based on, for example, a simple surface-height measurement. Since the situations on the substrate can vary over the substrate surface, regions of the substrate having different GH "signatures" result in different GHC's being determined for the regions.

Measurements of substrate height using a physical sensor are important in the subject methods because physical sensors are substantially independent of and unaffected by GH effects. I.e., a physical sensor directly measures position of the top surface of a resist (or other) layer and is usually unaffected by structure located beneath the top layer (i.e., the physical sensor is substantially "immune" to) the GH effect. However, because of their inherent slowness, physical sensors usually can only be used sparingly during a normal production-throughput situation to avoid compromising the throughput of the microlithography tool. An exemplary time in which physical sensors can be used (including extensively used) without compromising throughput is during lithographic "process development" (a setup period in which an exposure process for a new reticle pattern is developed, refined, and tested on the tool before commencing normal high-throughput use of the tool). Process development normally involves setting up the microlithography tool to expose a different reticle than the previously exposed reticle. During process development, physical sensors can be used (including extensively used) without being concerned about production throughput. The physical data thus obtained can usually be extrapolated to all the substrates that will ensue from the particular process being developed, particularly if the exposed pattern is the same from substrate to substrate, and there is substantial uniformity from one substrate to the next. Some physical data can also be obtained during operation of the microlithography tool on a normal production schedule, but this data gathering will usually be limited to sampling at a limited area on each substrate. This sampling can be random or according to a predetermined sampling protocol.

It is desirable to refine GHC determinations performed with physical sensors by taking into consideration data obtained using an optical sensor, e.g., a conventional optical AF sensor. The data obtained using an optical sensor includes data obtained from the same regions of the substrate surface that were investigated using the physical sensor(s). Optical detection of substrate focus can be performed very rapidly, allowing the optical detections to be performed contemporaneously during use of the microlithography tool in normal production.) The results of optical measurements can be fit to the physical data to obtain GHC coefficients that more closely relate to the actual surface topography of the substrate than prior-art methods, thereby providing more accurate GHC's and eliminating the need to estimate GH effects. The resulting set of corrected GHC coefficients can be stored (e.g., as a "map") and applied later during actual production use of the microlithography tool according to the developed process.

During normal production use of the developed process, substrate heights can be measured using an optical AF device in the normal manner, e.g., before each exposure. These optically obtained data can be calibrated according to the GHC's previously determined, providing more accurate determinations of GHC during production than obtainable by conventional empirical methods.

A flowchart of an embodiment of the general method described above is shown in FIG. 2. The method 10 includes steps desirably performed during process development as well as steps that can be performed during use ("real-time") of the microlithography tool for actual production. During process development or other time period in which time is not critical for use of the tool, substrate-height data are obtained using one or more physical sensors (item 12). These data are used to produce a physical-data map (item 14) of the surface of the substrate. Also during process development or other time period in which time is not critical, substrate-height data are obtained using one or more optical sensors (item 16), and these data are used to produce an optical-data map (item 18) of the surface of the substrate. The physical-data map and optical-data map can be regarded as respective data sets. In the embodiment 10, the "fit" of the respective data sets with each other is determined and assessed (item 20). Since the physical-data map is unaffected by GH effects and the optical-data map can include GH effects, assessing fitness of the data over the substrate surface yields a map of calibrated GHC coefficients (item 22). Later, using the tool during actual production, AF measurements are obtained, when and where desired, using one or more optical sensors (item 24). These AF data are corrected as required or desired (item 26), using the corresponding GHC coefficients of item 22. Therefore, the actual optical data are accurately "corrected" in real time according to the map obtained in item 22. The correction is performed using data that were efficiently collected and assessed during time periods in which time was not pressing, e.g., during process development.

Figure 2:
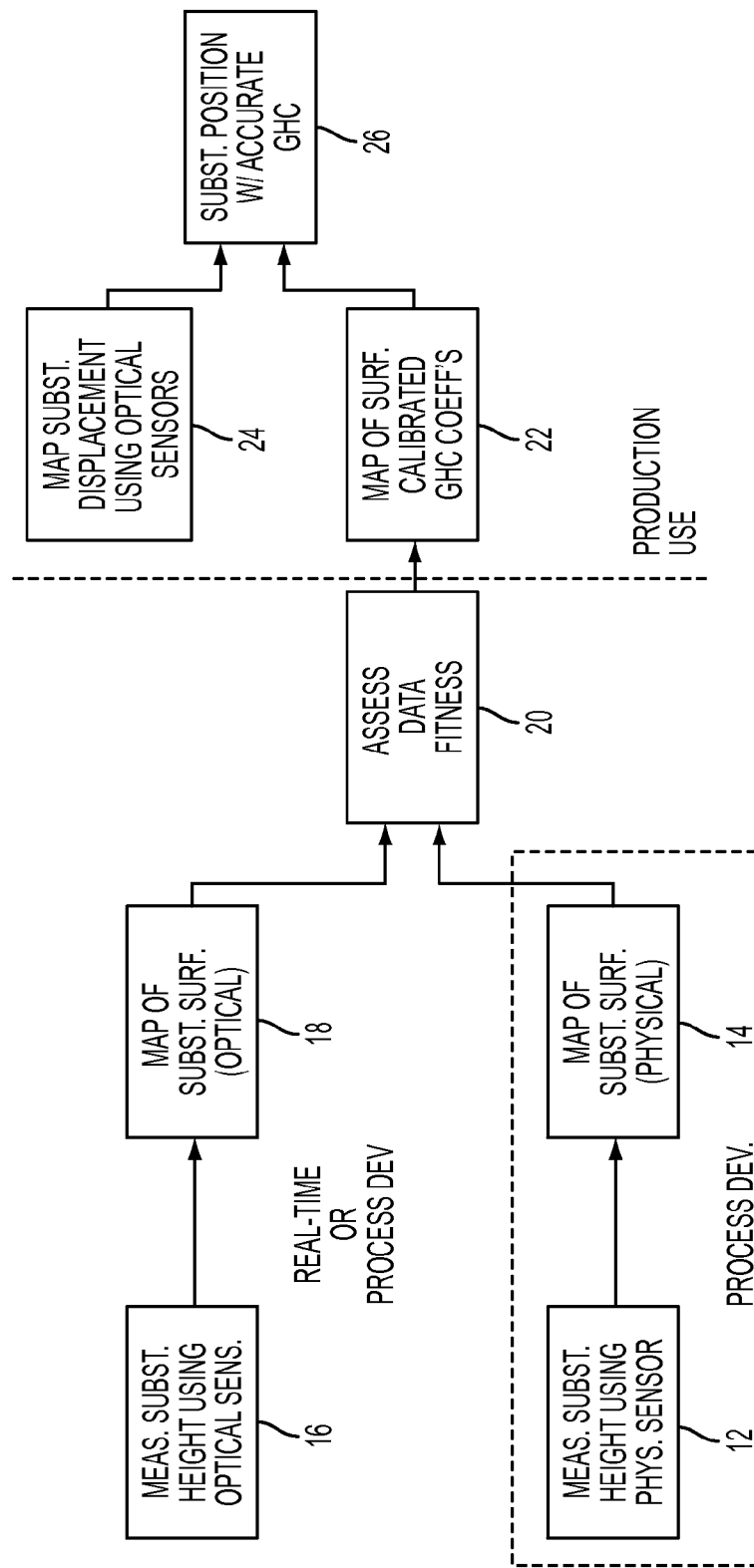
FIG. 2 is a flow chart of an exemplary embodiment of a method for determining substrate position, including measurement and correction of actual GH effects.

In FIG. 2, item 12 can be eliminated partially or completely if a priori physical data are already available for at least a region of the substrate, if the need to obtain physical data is unnecessary, or if the effect of the physical data on GH behavior is already known. For example, certain regions of the substrate may be known not to exhibit any significant GH effects, or may be known to produce an average GH effect, or may be known to produce only a general (spatially independent) GH effect. Alternatively, advance knowledge may exist that certain patterns and/or pattern features on the substrate cause particular focus anomalies due to the GH effect while other regions of the substrate do not. This a priori knowledge may allow reducing the scope of detailed physical data to be obtained for the substrate. Alternatively or in addition, quantitative knowledge of the GH effect in certain regions of the substrate may already exist, in which event the physical data may be obtained without having to use physical sensor(s) at all in such regions, or perhaps the physical data can be obtained at fewer loci than otherwise would be used in other focus-anomaly regions. Furthermore, in some instances, it may be that the particular reticle pattern being exposed on the substrate produces no significant focus anomalies, in which event a decision can be made to obtain general GHC data only.

Items 12 and 14 are desirably performed during process development because they involve use of physical sensor(s) and physical data, which are slow compared to the use of optical sensor(s) to obtain optical data. Items 16, 18, and 20 involve use of optical sensors, which are typically faster in producing data than physical sensors. Consequently, items 12 and 14 desirably are performed during process development or other time period when throughput concerns are relaxed. Items 16, 18, and 20 usually can be performed at any convenient time, such as during process development or during use of the microlithography tool for actual production.

In various embodiments the obtained physical and optical data are combined according to any of various routines for achieving a desired calibration of GHC under the prevailing limitations of substrate, previously formed layers, pattern, materials, time budget, etc. The routines can be used singly or in any of various combinations. They can be used in any convenient order. The routines allow, for example, different regions of the substrate to receive different respective levels of GHC, depending on actual spatial differences (e.g., peculiarities of peripheral regions of the substrate versus central regions), chip-to-chip differences, intra-chip pattern differences (e.g., in different regions of chips) and/or optical differences (e.g., depthwise differences in materials, depthwise differences in patterns, differently sized pattern features, etc.). Each of the routines provides a respective "corrected" GHC.

As noted, an exemplary time for obtaining at least some of the data for determining corrected GHC's is during process development. Corrected GHC's determined during process development can be applied during production use of the microlithography tool for normal production, thereby saving substantial production time. If a focus anomaly is encountered or otherwise revealed involving a particular region(s) of the pattern, the problem may be caused by a GH effect associated with the particular region(s). In respective routines, the optical data are obtained using an optical AF sensor, while physical data are obtained using a GH-immune physical sensor such as an air gauge. The obtained optical and physical data are used in a data-fitting procedure for determining the coefficients of the GHC. The determined quality of the fit ("goodness-of-fit" ("GOF") determination) allows decisions to be based (at least in part) on actual patterns on actual substrates. For example, during development of the GHC, a determination is made of how well the determined GHC's correlate to corresponding physical data over some range of AF measurements. When an AF measurement is obtained that is known to have a poor GOF, the GOF can be used to decide whether or not to go in and measure that area with a physical sensor or rather to de-weight it in the estimate of the best-focus position.

Exemplary routines for obtaining and using GHC's are described below.

1. Basic GHC

In this routine basic GHC's are determined for respective locations on a substrate received by a precision system. The GHC's can be determined as described above in connection with FIG. 2, determined empirically, or determined by any other convenient method. The resulting substrate-height correction function can be cast in terms of, for example, a linear combination of measured substrate heights and reflectivities at different wavelengths and polarizations. The coefficients of the correction function thus determined are compared with data produced by a physical height sensor.

The physical data can be from, for example: (a) x, y, z data obtained using a physical sensor (e.g., air gauge), (b) other x, y, z physical data, (c) other already known information about the substrate and/or the pattern(s) in underlying layers, (d) data obtained using an actinic-wavelength optical sensor (see U.S. Patent Publication No. 2010/0233600 A1), or other suitable source of information. (Another source of suitable information is a focus map produced by evaluating exposed, and probably developed, patterns. Such patterns may be especially designed to provide focus information.) The physical data are usually obtained before using the precision system for normal production. E.g., the physical data are obtained or otherwise exist during use of the system for process development.

The optical-sensor data and physical-sensor data are combined by a data-fitting procedure, such as least squares, to produce optimized sets of coefficients used in the GHC-correction function. The quality of the data-fitting procedure (goodness of fit; GOF) can be utilized in subsequent decisions regarding whether GHC corrections are indicated and regarding where those corrections are to be made, based upon the actual pattern and substrate.

The resulting GHC can be applied to all relevant locations on the wafer, including locations where physical-sensor data are lacking.

2. Spatially Varying GHC

This routine particularly addresses situations in which the GH effect (and thus the GHC) differs substantially in certain regions of the substrate compared to other regions (e.g., chip-to-chip or otherwise from one region of the substrate to another), producing a spatially variable GHC. For example, GH effects may be more pronounced at isolated regions of a substrate (e.g., near edges compared to central regions), producing a different set of GHC coefficients, and even possibly different functional forms for each such region.

The resulting GHC can be applied to all relevant locations on the wafer, including locations where physical-sensor data are lacking.

3. Estimation of GHC Error

A GHC calibration can yield, besides altered GHC coefficients, an estimate of the error in the correction (not the same as a GH error), which provides information on where a conventionally determined GHC algorithm breaks down. A measure of the error is given by the quality of the GOF. This information can be simply spatially dependent, where a basic GHC cannot be applied in certain regions on a chip or die, as verified from the physical sensor data. Alternatively, this information can be measurement-dependent. For example, there may be instances of strong GH effect wherever spectral measurements (see routine 1) are strongly divergent.

4. Spatially Periodic Correction to GHC

This routine assumes that pattern-dependent phase errors are significant, and takes advantage of the pattern repeatability from chip to chip (for the same die; some substrates may have several different dies). The optical AF device is calibrated over a chip field using the physical sensor. This avoids having to obtain measurements over the entire wafer, since only the chip field is measured. Pattern-dependent corrections to basic GHC are defined as respective functions of location within the chip field. The GHC's represent offsets to results obtained in routines 1 or 2. The corrections should be applicable to similar locations in other chip fields.

In performing this routine, the basic GHC handles less local thin-film variations. The results of this routine desirably are checked initially with data from several chips or from an entire substrate.

4a. Same Pattern Conditions at Different Chip Sites

This routine takes advantage of pattern repeatability from chip to chip, and involves comparing GHC's for the same pattern conditions at different chip sites. Differences in GHC at these different sites would arise mainly from film thickness or refractive-index variations. This analysis in principle should not require additional use of a physical sensor, but obtaining additional pattern-dependent corrections using a physical sensor may be more straightforward than not using a physical sensor. This routine can be used as a check to Routine 4, where chip-to-chip differences are estimated from the Basic GHC of Routine 1.

5. GHC Weighting to an Estimate of the Substrate Plane

The GHC calibration performed in routine 3, above, may reveal regions of a chip field in which pattern-dependent effects are large and their correction less reliable from chip to chip, or in which the empirical GHC estimate is less reliable due to certain patterns or portions of patterns, as reflected in a poor GHC result. When these regions are discovered (so long as they do not cover a significant fraction of the chip area), they can be ignored when determining the corrected GHC. Optical AF measurements are used to determine the best height as well as tilt and tip of the area being exposed during scanning over the substrate. This routine may either omit some height information within the exposure area, or may weight some of the information less strongly, to avoid possible errors in the wafer height or orientation arising from less reliable GHC's. The weighting function may be related to the GOF.

6. GHC-Based Selection of Physical-Sensor Measurement Sites for Calibration

Regions producing focus anomalies and in which GHC corrections break down may be salvageable if GHC-calibration data are obtained at a higher density. After experience with test wafers during process development, it may be found that the physical-sensor measurements should be spaced at a variable density that depends upon the chip patterns.

7. User-Selectable Weighting

Regions of which a higher density of calibration measurements are taken (leading presumably to greater wafer-height accuracy and greater orientation accuracy) can be user-selectable, ensuring that focus-critical regions of the chip are in best focus.

8. Using Other Data in GHC Calibration

In addition to using a physical sensor and using user-selected weighting, information resulting from focus-exposure matrices may also be applied to the GHC when determining the coefficients, estimated error, spatially dependent correction, GHC weighting to wafer-plane estimates, and physical-sensor measurement sites.

Figure 3:
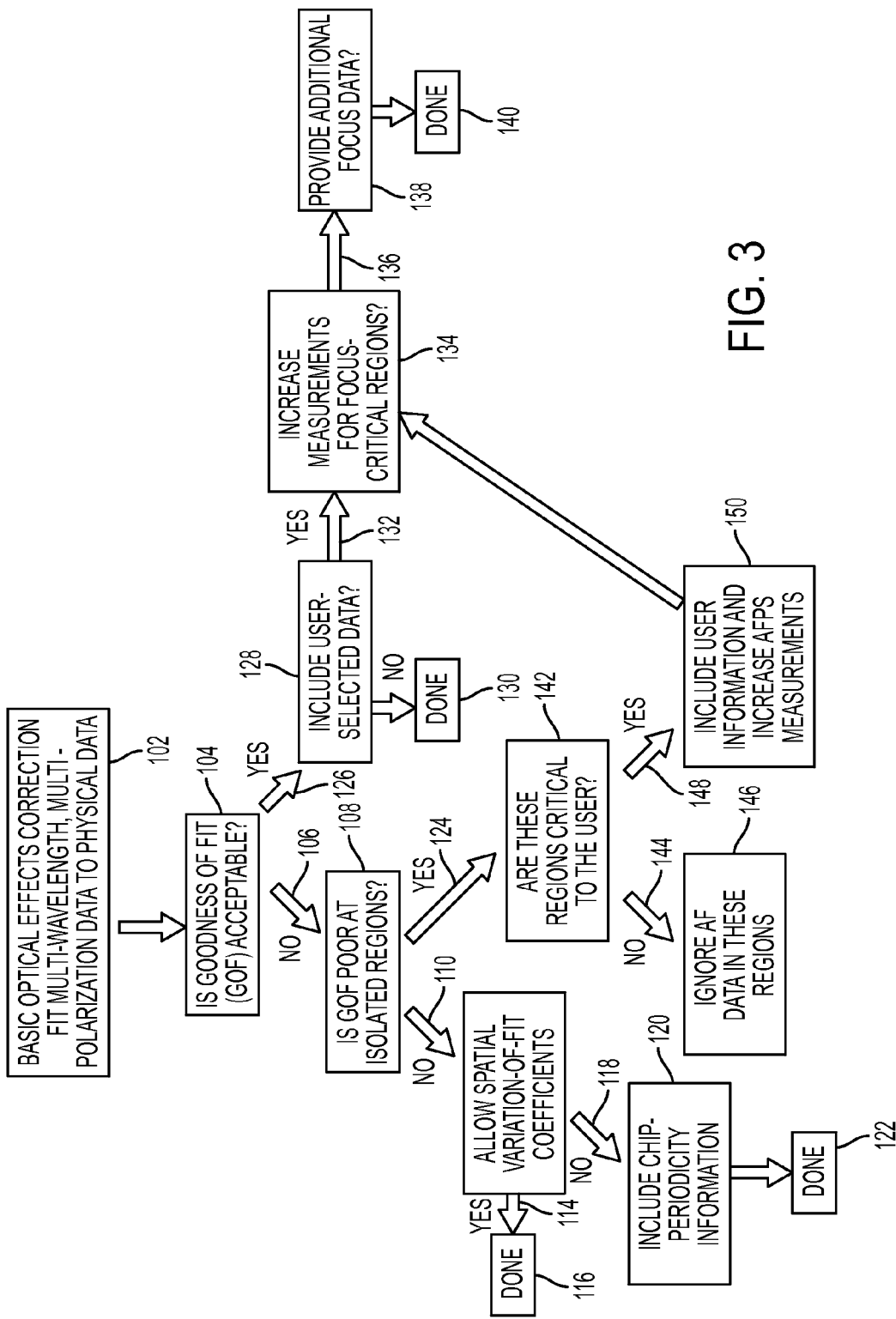
FIG. 3 is a flow chart of an exemplary manner in which, in the embodiment of FIG. 2, physical-sensor data are fit to optical-sensor data and the goodness of fit is assessed and applied to determine a reliable GHC for a particular substrate.

An embodiment of a protocol for use of one or more of the routines for achieving a corrected GHC is diagrammed in FIG. 3. In the depicted method a fit is made of the data obtained using the optical AF sensor with corresponding data obtained using the physical sensor. Downstream decisions and determinations are made based on the acceptability of the goodness of this fit (GOF).

This embodiment of a method (100) for making pattern-dependent corrections to a GHC is set forth as a decision tree that includes weighting of the relative importance of various pattern regions on the wafer contributing to calculations of the corrections. The method incorporates various routines.

In step 102 of the method 100 shown in FIG. 3, basic wafer-height measurements are obtained and evaluated to determine possible inclusion of GH effects in the measurements. Optical height data are obtained at different respective wavelengths and/or at different respective polarizations. The data are combined with corresponding physical wafer-height data obtained over the wafer surface to determine the GHC by a fitting procedure. The quality of the fitting procedure, the GOF, is thus determined (step 104). If the GOF is not acceptable (arrow 106), then the method moves to step 108 in which a determination is made of whether the poor GOF is due to the GOF being poor at isolated regions of the wafer, compared to other regions of the wafer. If the GOF is not relatively poor at isolated regions (arrow 110), then the method moves to step 112, in which a determination is made of whether spatial variations of the GOF coefficients shall be allowed. If yes (arrow 114), then the method is concluded (116). If not (arrow 118), then the method moves to step 120, in which chip periodicity information is included, resulting in conclusion of the method (120).

Returning to step 104, if the GOF is acceptable, the method moves (arrow 126) to step 128, providing the option of including user-selectable data. If user-selectable data are not to be included, the method concludes (130). On the other hand, if user-selectable data are to be included (arrow 132), the method moves to step 134, in which measurements for focus-critical regions can be increased. This leads (arrow 136) to step 138 in which additional focus data are provided, which concludes the method (140).

Returning to step 108, if the GOF is determined to be poor at isolated regions (arrow 124), the method moves to step 142, in which a determination is made of whether the isolated regions are critical to the user. If they are not critical (arrow 144), then the AF data in these regions can be ignored or weighted less strongly (146). If they are critical (arrow 148), then the method moves to step 150, in which the data are included, and auto-focus physical sensor measurements can be increased. This result also leads to step 134, in which measurements for focus-critical regions are increased (see above).

Figure 4:
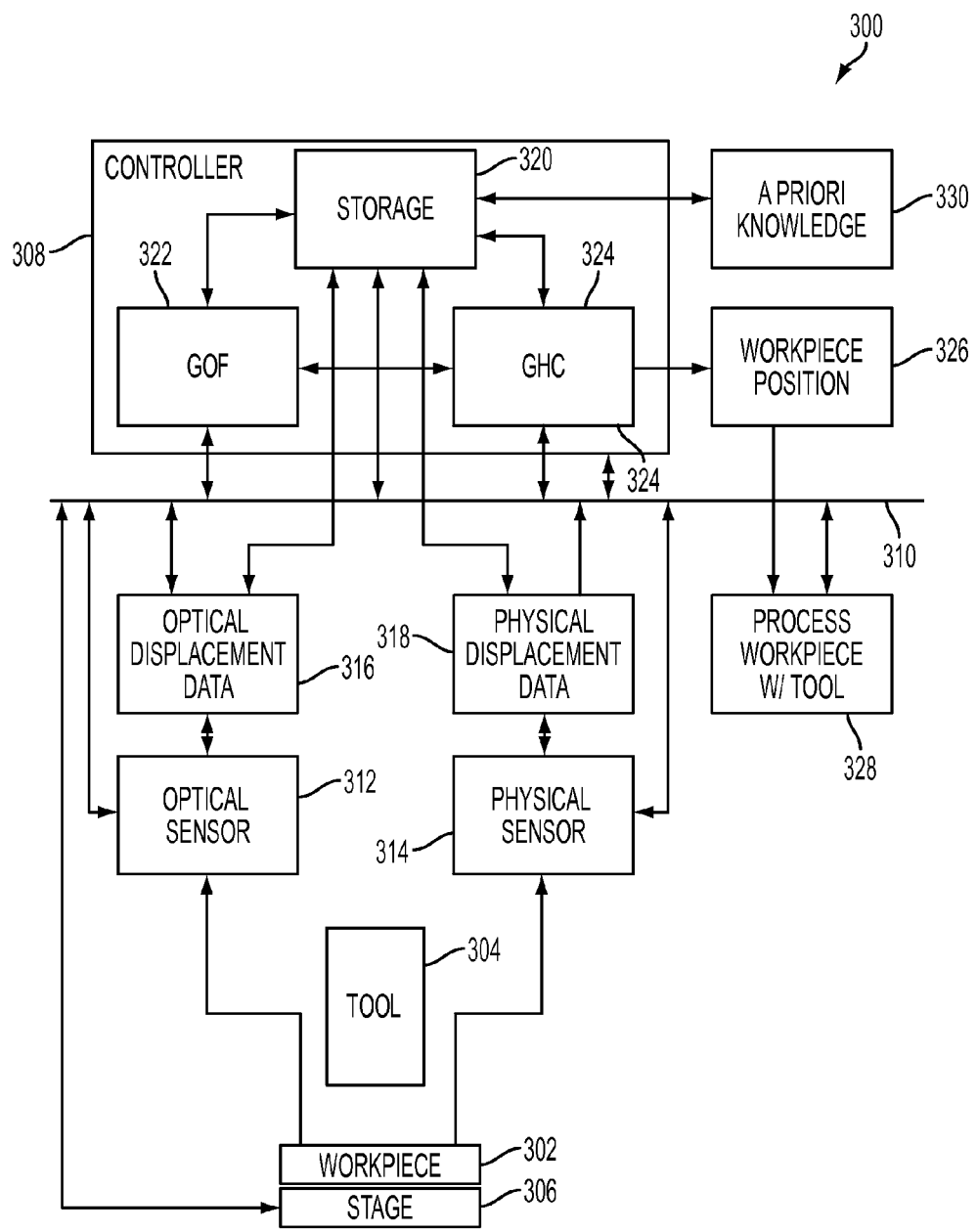
FIG. 4 is a flow chart of an exemplary embodiment of a portion of a control system of a precision system that is configured to determine and correct for a GH effect in a manner as disclosed herein.

FIG. 4 illustrates an embodiment of an apparatus 300 for performing a process on a workpiece 302, wherein the workpiece is positionable relative to a tool 304. Specifically, the workpiece 302 is situated on a stage 306 configured to move the workpiece relative to the tool 304. The apparatus 300 also includes a controller 308 that is connected via a communications bus 310 to other components of the apparatus. An optical sensor 312 and a physical sensor 314 are situated relative to the workpiece 302. The optical sensor 312 produces optical displacement data 316 concerning the position of the workpiece 302 (as mounted on the stage 306) relative to the tool 302. The physical sensor 314 produces physical displacement data 318 concerning the position of the workpiece 302 (as mounted on the stage 306) relative to the tool. The optical and physical sensors 312, 314 are coupled to and controllably operated by the controller 308. The controller 308 is also coupled to receive the physical displacement data 318 and the optical displacement data 316. From these connections the controller 308 can place the data in storage 320 in, for example, a memory. The controller 308 is also coupled to deliver the physical displacement data 318 and optical displacement data 316 for determinations, by respective portions of the controller, of goodness of fit (GOF) 322 of the optical and physical data as well as the GHC's 324 corresponding to the results of the GOF determinations. The results of the GOF and/or GHC determinations can be routed to storage 320 for later recall, if necessary or desired. The determined GHC's are utilized for determining actual workpiece position 326, which is a key to commencing processing 328 of the workpiece 302 using the tool 304. The controller 308 is also coupled to receive a priori knowledge 330 of workpiece characteristics including, but not limited to, features affecting GH behavior.

The present embodiment is also applicable to the liquid immersion type exposure apparatus, for example, as disclosed in U.S. Patent Application Publication No. 2011/0086315.

Further, in the embodiment above, a light transmissive type mask (reticle) is used, which is obtained by forming a predetermined light-shielding pattern (or a phase pattern or a light-attenuation pattern) on a light-transmitting substrate, but instead of this reticle, as disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display element (spatial light modulator) or the like) on which a light-transmitting pattern, a reflection pattern, or an emission pattern is formed according to electronic data of the pattern that is to be exposed can also be used. In the case of using such a variable shaped mask, a stage on which a work piece e.g. a wafer, a glass plate or the like is mounted is scanned relative to the variable shaped mask, and therefore the equivalent effect to the embodiment above can be obtained by measuring the position of this work piece using an the focus system.

Further, as disclosed in, for example, PCT International Publication No. 2001/035168, the embodiment above can also be applied to an exposure apparatus (a lithography system) in which line-and-space patterns are formed on wafer by forming interference fringes on the substrate.

Moreover, the embodiment above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

Incidentally, an object on which a pattern is to be formed (an object subject to exposure on which an energy beam is irradiated) in the embodiment above is not limited to a wafer, but may be another object such as a glass plate, a ceramic substrate, a film member, or a mask blank.

The usage of the exposure apparatus is not limited to the exposure apparatus used for manufacturing semiconductor devices, but the embodiment above can be widely applied also to, for example, an exposure apparatus for manufacturing liquid crystal display elements in which a liquid crystal display element pattern is transferred onto a rectangular glass plate, and to an exposure apparatus for manufacturing organic EL, thin-film magnetic heads, imaging devices (such as CCDs), micromachines, DNA chips or the like. Further, the embodiment above can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

The exposure apparatus according to the foregoing embodiments are manufactured by assembling various subsystems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various subsystems into the exposure apparatus include mechanical connections, wire connections of electric circuits, pipe connections of pneumatic circuits, etc. between the various subsystems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Incidentally, the disclosures of all publications, the PCT International Publications, the U.S. Patent Application Publications and the U.S. Patents that are cited in the description so far related to exposure apparatuses and the like are each incorporated herein by reference to the fullest extent allowed by law.

Figure 5:
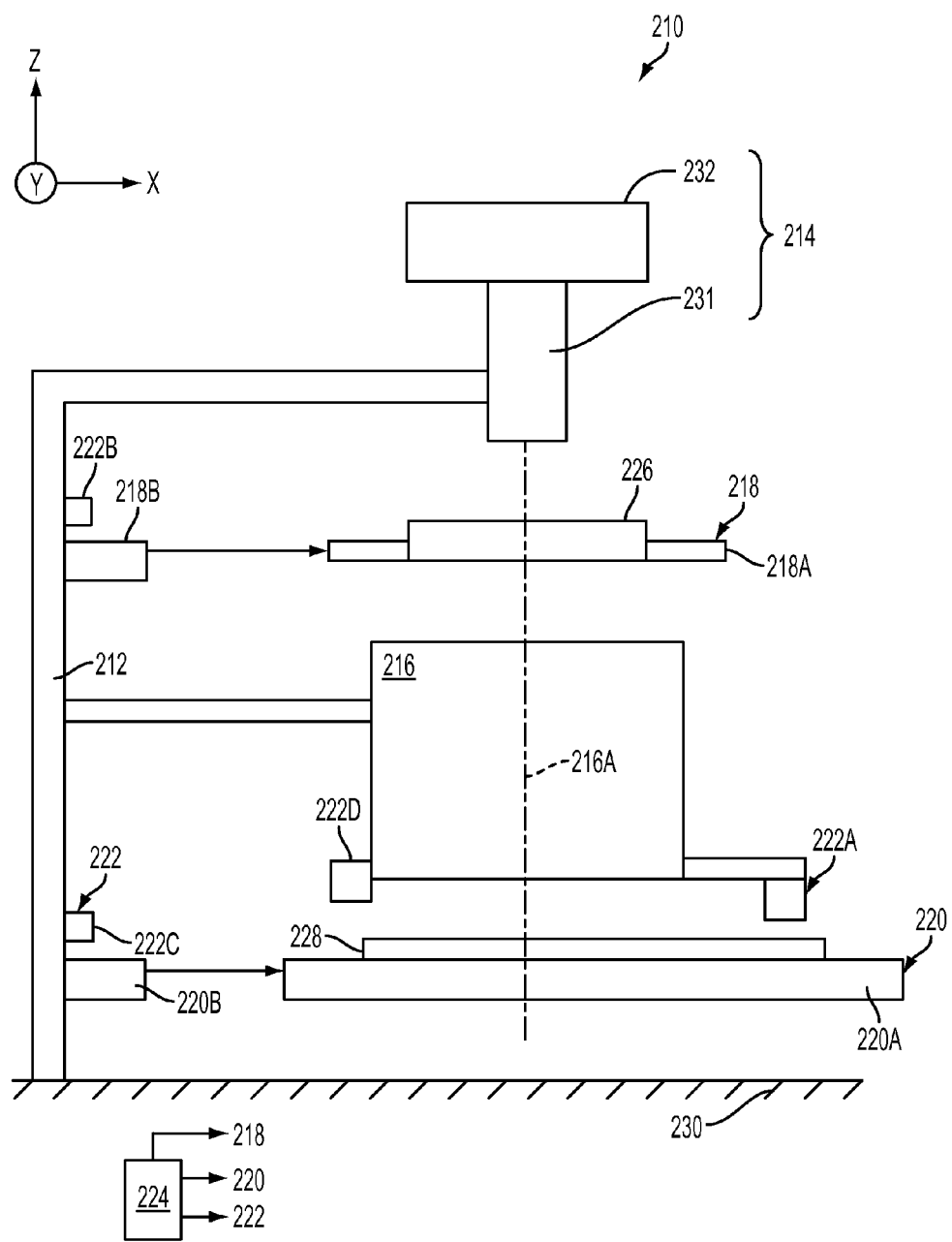
FIG. 5 is a schematic diagram of a microlithographic exposure system, as a representative precision system, that performs autofocus according to the invention described herein.

Included in this disclosure are any of various precision systems that include a highly accurate and precise positioning mechanism as disclosed above. An example of a precision system is a microlithography system or exposure "tool" used for manufacturing semiconductor devices. A schematic depiction of an exemplary microlithography system 210, including reticle prepared as described herein, is provided in FIG. 5. The system 210 includes a system frame 212, an illumination system 214, an imaging-optical system 216, a reticle-stage assembly 218, a substrate-stage assembly 220, a positioning system 222, and a system-controller 224. The configuration of the components of the system 210 is particularly useful for transferring a pattern (not shown) of an integrated circuit from a reticle 226 onto a semiconductor wafer 228. The system 210 mounts to a mounting base 230, e.g., the ground, a base, or floor or other supporting structure. The system also includes an autofocus system 222a that measures the position of the wafer (as an exemplary workpiece) along an axis (e.g., the z-axis or optical axis) with improved accuracy and precision as a result of the autofocus system comprising features as described herein.

Figure 6:
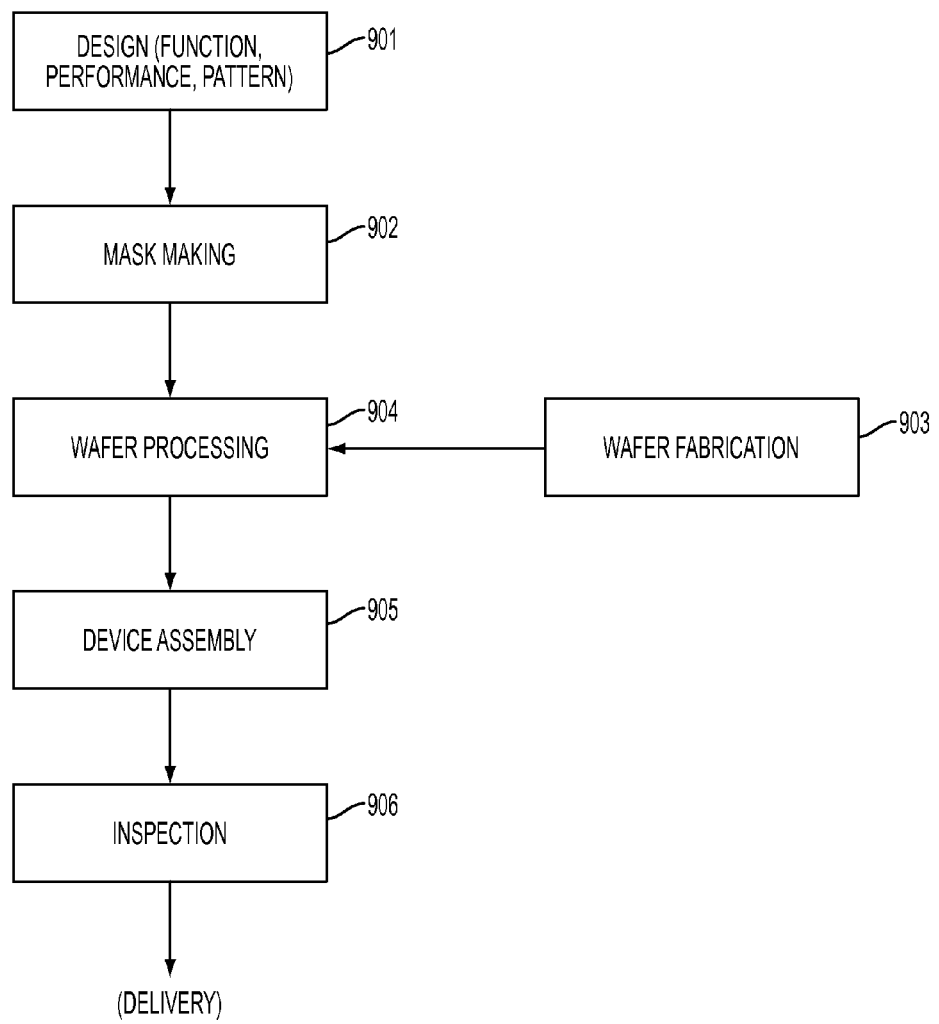
FIG. 6 is a flow-chart outlining a process for manufacturing a semiconductor device.

An exemplary process for manufacturing semiconductor devices, including an exposure step, is shown in FIG. 6. In step 901 the device's function and performance characteristics are designed. Next, in step 902, a mask (reticle) having a desired pattern is designed according to the previous designing step, and in a parallel step 903 a wafer is made from a suitable semiconductor material. The mask pattern designed in step 902 is exposed onto the wafer from step 903 in step 904 by a microlithography system described herein in accordance with the present invention. In step 905 the semiconductor device is assembled (including the dicing process, bonding process, and packaging process. Finally, the device is inspected in step 906.

Figure 7:
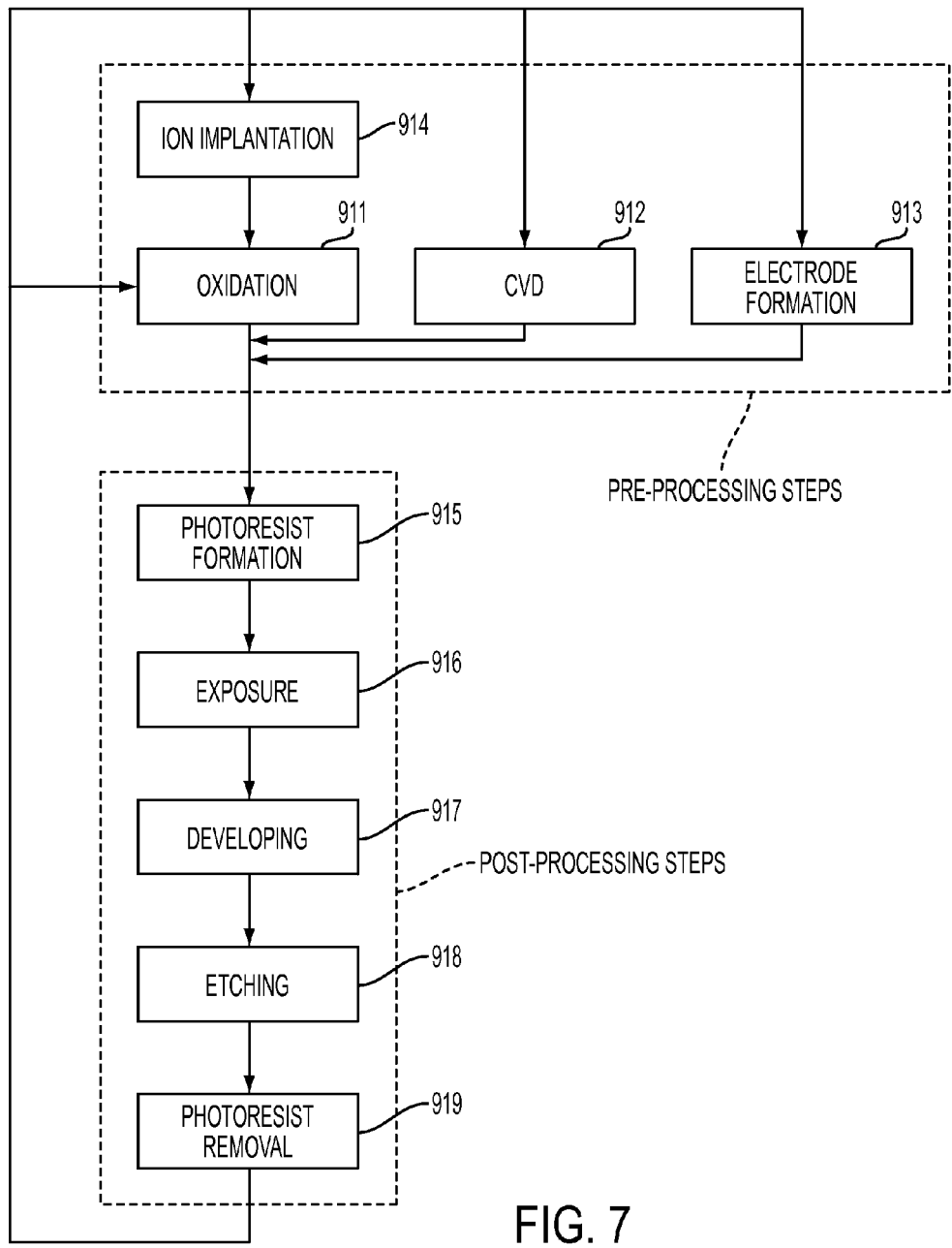
FIG. 7 is a flow-chart of a portion of a device-manufacturing process in more detail.

FIG. 7 is a flowchart of the above-mentioned step 904 in the case of fabricating semiconductor devices. In FIG. 7, in step 911 (oxidation step), the wafer surface is oxidized. In step 912 (CVD step), an insulation film is formed on the wafer surface. In step 913 (electrode-formation step), electrodes are formed on the wafer by vapor deposition. In step 914 (ion-implantation step), ions are implanted in the wafer. The above-mentioned steps 911-914 constitute the preprocessing steps for wafers during wafer processing, and selection is made at each step according to processing requirements.

At each stage of wafer-processing, when the above-mentioned preprocessing steps have been completed, the following "post-processing" steps are implemented. During post-processing, first, in step 915 (photoresist-formation step), photoresist is applied to a wafer. Next, in step 916 (exposure step), the above-mentioned exposure device is used to transfer the circuit pattern of a mask (reticle) to a wafer. Then, in step 917 (developing step), the exposed wafer is developed, and in step 918 (etching step), parts other than residual photoresist (exposed material surface) are removed by etching. In step 919 (photoresist-removal step), unnecessary photoresist remaining after etching is removed. Multiple circuit patterns are formed by repeating these pre-processing and post-processing steps.

Whereas the invention has been described in the context of multiple representative embodiments, it will be understood that it is not limited to those embodiments. On the contrary, it is intended to cover all modifications, alternatives, and equivalents as may be including within the spirit and scope of the invention, as defined by the appended claims.

What is claimed is:

1. A method for determining a Goos-Hänchen correction (GHC) in an optical autofocus system that uses light reflected from a substrate to determine corresponding changes in a height of the substrate, the method comprising:
    using an optical height sensor, obtaining a first set of height data of at least a region of the substrate, the height data corresponding to respective loci on the substrate and comprising measurements involving at least one optical wavelength and/or at least one polarization state of light utilized by the optical height sensor;
    from the first set of height data, determining a first GHC function including respective coefficients;
    determining a first map of the substrate surface by applying the first GHC function to the first set of height data corresponding to at least the region;
    using a physical height sensor, obtaining a second set of height data of at least the region of the substrate;
    from the second set of height data, determining a second map of the substrate surface corresponding to at least the region; and
    in at least the region of substrate, correcting the first GHC function by comparing the first and second maps of the substrate.

2. The method of claim 1, further comprising determining a goodness of fit of the first and second GHC functions.

3. The method of claim 2, further comprising assessing, in at least the region, the corrected GHC function based on the goodness of fit.

4. The method of claim 3, wherein the at least one region is an isolated region on the substrate.

5. The method of claim 4, further comprising allowing a spatial variation of fit coefficients based on the assessment of goodness of fit in the isolated region.

6. The method of claim 4, further comprising:
    assessing criticality of the isolated region based on the assessment of goodness of fit in the isolated region; and
    if the isolated region is focus-critical, increasing physical-sensor measurements in the isolated region.

7. The method of claim 6, further comprising:
    including user-selected data based on the assessment of goodness of fit; and
    if the region is a focus-critical region, then increasing physical-sensor measurements in the region.

8. The method of claim 7, further comprising, if the assessed goodness of fit is unsatisfactory, determining whether the goodness of fit is unsatisfactory due to it being relatively poor at one or more isolated regions of the substrate compared to other regions of the substrate.

9. The method of claim 7, further comprising, if the goodness of fit is not relatively poor at any isolated region of the substrate, determining whether any spatial variations of goodness-of fit coefficients are allowable.

10. The method of claim 7, further comprising, if spatial variations of goodness-of-fit coefficients are not allowable, including data chip periodicity information in the assessment of goodness of fit.

11. The method of claim 7, further comprising, if the goodness of fit is relatively poor at one or more isolated regions of the substrate, then determining whether the isolated regions are critical.

12. The method of claim 11, further comprising, if the isolated regions are not critical, disregarding data from the isolated regions or reducing any weighting applied to said data.

13. The method of claim 11, further comprising, if the isolated regions are critical, including data from the isolated regions or increasing any weighting applied to said data.

14. The method of claim 1, further comprising considering user-selectable data in the assessment of goodness of fit.

15. The method of claim 1, wherein the coefficients of the first GHC function are determined empirically.

16. The method of claim 1, wherein data in the first set indicate at least one height anomaly of the substrate caused by the GH effect.

17. The method of claim 1, wherein, in the first GHC function, substrate height is a function of at least one optical parameter.

18. The method of claim 1, wherein the first GHC function is in terms of a linear combination of substrate heights and reflectivities at multiple wavelengths, multiple polarizations, or both.

19. The method of claim 1, wherein the coefficients are spatially dependent in the first GHC function.

20. The method of claim 1, wherein the first GHC function includes an estimate of error therein.

21. The method of claim 1, wherein:
the first set of data reflects similarity of pattern from chip to chip on the substrate; and
the second GHC function defines a pattern-dependent correction of the GHC as a function of position in a chip field.

22. The method of claim 21, further comprising applying the correction to similar respective locations in other chip fields on the substrate.

23. The method of claim 1, further comprising comparing GHC's for similar pattern conditions at different chip sites on the substrate.

24. The method of claim 1, wherein:
the at least one region includes a focus anomaly; and
the second set of height data in the region includes data obtained at a higher density than outside the region.

25. The method of claim 1, wherein the second set includes data spaced at a variable density inside the region compared to outside the region.

26. The method of claim 1, wherein the region is user-selectable.

27. The method of claim 1, wherein the coefficients in the second GHC function include user-selectable weighting.

28. A method for automatically positioning a substrate in a lithography tool using an autofocus system, comprising a method for correcting a Goos-Hänchen (GH) correction (GHC) in an optical autofocus system in the tool that uses light reflected from a substrate to determine corresponding changes in the height of the substrate, the method of correcting the GH effect comprising:
from a GH-sensitive source, obtaining a first set of height data of at least a region of the substrate, the height data corresponding to respective points on the substrate and comprising measurements involving at least one optical wavelength and/or at least one polarization state of light utilized to obtain the first set of height data;
from the first set of height data, determining a first GHC function including respective coefficients;
determining a first topographic map of the substrate by applying the first GHC function to the first set of height data;
from a GH-insensitive source, obtaining a second set of height data of at least the region of the substrate;
from the second set of height data, determining a second topographic map of the substrate; and
in at least one region of substrate, correcting the first GHC function by comparing the first and second topographic maps of the substrate.

29. The method of claim 28, wherein:
the GH-sensitive source comprises at least one physical height sensor; and
the GH-insensitive source comprises at least one optical height sensor.

30. The method of claim 29, wherein at least some data in the second set of height data are obtained during a non-production use of the lithography tool.

31. A focus controller electrically connected to a processor in a lithography tool, the focus controller being programmed to position the substrate automatically in the lithography tool using an optical autofocus system, the processor being programmed to determine a Goos-Hänchen (GH) correction (GHC) in the optical autofocus system by sensing light reflected from the substrate to determine corresponding changes in the height of the substrate, and to determine the GHC by a method comprising:
using at least one GH-sensitive height sensor, obtaining a first set of height data of at least a region of the substrate, the height data corresponding to respective points on the substrate and comprising measurements involving at least one optical wavelength and/or at least one polarization state of light utilized by the at least one GH-sensitive height sensor;
from the first set of height data, determining a first GHC function including respective coefficients;
determining a first topographic map of the substrate by applying the first GHC function to the first set of height data;
using at least one GH-insensitive height sensor, obtaining a second set of height data of at least the region of the substrate;
from the second set of height data, determining a second topographic map of the substrate; and
in at least one region of substrate, correcting the first GHC function by comparing the first and second topographic maps of the substrate.

32. A microlithography system, comprising a focus controller as recited in claim 31.

* * * * *